(12) United States Patent
Lee et al.

(10) Patent No.: US 7,378,708 B2
(45) Date of Patent: May 27, 2008

(54) TRANSISTOR HAVING A PROTRUDED DRAIN

(75) Inventors: Tae-Jung Lee, Gyeonggi-do (KR); Soo-Cheol Lee, Seoul (KR); Dong-Ryul Chang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/705,354

(22) Filed: Feb. 12, 2007

(65) Prior Publication Data

US 2007/0145477 A1    Jun. 28, 2007

Related U.S. Application Data

(62) Division of application No. 10/952,105, filed on Sep. 28, 2004, now Pat. No. 7,193,271.

(30) Foreign Application Priority Data

Sep. 29, 2003  (KR) .................................. 03-67244

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................... 257/328; 257/335; 257/336; 257/E21.417

(58) Field of Classification Search ................ 257/328, 257/335, 336, 339, 344, E21.417
See application file for complete search history.

(56) References Cited

U.S. PATENT DOCUMENTS 5,798,278 A    8/1998  Chan et al.
6,441,431 B1 *  8/2002  Efland et al. ............... 257/335

FOREIGN PATENT DOCUMENTS

JP    2000-40817    2/2000
KR    10-0251754    1/2000

* cited by examiner

*Primary Examiner*—Thien F Tran
(74) *Attorney, Agent, or Firm*—Mills & Onello LLP

(57) ABSTRACT

A field effect transistor includes a gate that is formed in a channel region of an active region defined on a substrate. A source is formed at a first surface portion of the active region that is adjacently disposed at a first side face of the gate. A drain is formed at a second surface portion of the active region that is opposite to the first surface portion with respect to the gate. The drain has a protruded portion that is protruded from a surface portion of the substrate.

7 Claims, 8 Drawing Sheets

TRANSISTOR HAVING A PROTRUDED DRAIN

CROSS REFERENCE TO RELATED APPLICATION

This application is a divisional of U.S. application Ser. No. 10/952,105, filed on Sep. 28, 2004 now U.S. Pat. No. 7,193,271, which relies for priority upon Korean Patent Application No. 10-2003-0067244, filed on Sep. 29, 2003, the contents of which are herein incorporated by reference in their entirety.

BACKGROUND OF THE INVENTION

1. Field of the Invention

The present invention relates to a field effect transistor and a method of manufacturing the transistor. More particularly, the present invention relates to a field effect transistor having a drain that is protruded from a substrate, and a method for forming the transistor.

2. Description of the Related Art

In general, semiconductor transistors may be categorized as bipolar junction transistors (BJT) or field effect transistors (FET).

The BJT has electrons and holes as charge carriers. The electron and the hole carry charges in a single transistor. Thus, regardless of whether the transistor is an NPN transistor or a PNP transistor, the charge carrier in the BJT is the electron and the hole.

On the contrary, the FET has only a single charge carrier. The charge carrier is an electron in an N type FET and is a hole in a P type FET. The FET can be a metal-oxide-semiconductor FET (MOSFET) that is widely employed in semiconductor devices.

The MOSFET can be a complementary MOS (CMOS). The CMOS is used in most digital logic circuits. The CMOS has a low operation voltage. Accordingly, although a low voltage is applied to the CMOS, the CMOS may be normally operated. However, when a high voltage is applied to the CMOS, the CMOS may be abnormally operated. As a result, since the CMOS has a low breakdown voltage, the CMOS to which the high voltage is applied may malfunction.

Generally, a high-voltage transistor has a rectifying function and a switching function. To evaluate the functions of the high-voltage transistor, a breakdown voltage and a resistance in the high-voltage transistor are considered as important factors.

The operation voltage of the transistor is determined in accordance with the breakdown voltage. A high breakdown voltage is required for performing the rectifying and the switching functions of the high-voltage transistor when a high voltage is applied to the high-voltage transistor.

A breakdown generated in a semiconductor device is mainly an avalanche breakdown. The avalanche breakdown is caused by an electron-hole pair (EHP). The EHP is generated due to a collision of the charge carrier that receives energy generated by a strong electric field with a molecule for forming a crystalline structure of the semiconductor device. The strong electric field is applied to a depletion region. When the electron or the hole as the charge carrier moves in the depletion region, the electric field applied to the depletion region provides kinetic energy to the charge carrier so that the charge carrier collides with the molecule, thereby losing the kinetic energy. The EHP is then generated from the molecule. This mechanism continuously occurs to generate the avalanche breakdown in the semiconductor device. Thus, when the breakdown is generated, a great amount of current flows through a channel region of the transistor. As a result, the amount of the current varies remarkably in accordance with a tiny increase of voltage so that the semiconductor device may be uncontrollable.

Another breakdown is a Zener breakdown caused by tunneling. The Zener breakdown is generated in a PN junction doped with impurities at a high-concentration. A conduction band of an N type semiconductor device and a valence band of a P type semiconductor device overlap with each other, thereby generating the Zener breakdown. When a concentration profile of the PN junction quickly increases, the Zener breakdown is also generated. Accordingly, when the semiconductor device is doped with impurities at a high-concentration, Zener breakdown is generated before generating the avalanche breakdown. To prevent the occurrence of the Zener breakdown that is generated under a voltage that is relatively low compared to that causing the avalanche breakdown, a region doped with impurities at a low-concentration is required in source/drain regions of the transistor.

In order that the transistor may function as a switch, the channel has a low resistance when the transistor is turned-on, and the channel has a high resistance when the transistor is turned-off. In an ideal transistor, the resistance of the channel is about zero when the transistor is turned-on, and is infinite when the transistor is turned-off. However, in a real transistor, the channel has a resistance in the turned-on or the turned-off state. In particular, the non-infinite resistance of the transistor in the turned-off state causes a leakage current of the transistor. Further, a high resistance of the channel decreases a transmission efficiency of a signal through the channel.

Accordingly, the transistor has a high breakdown voltage and a low resistance to be operated at a high voltage. However, the resistance and the breakdown voltage have a trade-off relation that characteristics of the resistance are degraded when characteristics of the breakdown voltage are improved, and vice versa.

Many transistors are suggested for improving the characteristics of the resistance and the breakdown voltage.

A conventional transistor is formed so as to have a lightly doped drain (LDD) structure. Source/drain regions doped with impurities at a low-concentration are formed to surround source/drain regions doped with impurities at a high-concentration, respectively, to provide a high breakdown voltage to the transistor. The source region doped with impurities at a low-concentration is extended under a gate oxide layer. The drain region doped with impurities at a low-concentration is extended under a portion of the gate oxide layer that is disposed adjacent to the drain region doped impurities at a high-concentration impurity. A length of a channel region is shortened in the structure described above, thereby reducing the resistance of the transistor. Further, the source/drain regions doped with impurities at a low-concentration, which intersect each other at both sides of the gate oxide layer, prevent a hot-carrier injection generated in the channel region adjacent to the drain region doped with impurities at a high-concentration. Particularly, the source/drain regions doped with impurities at a low-concentration increase a width between the source/drain regions doped with impurities at a high-concentration so that the transistor has a high breakdown voltage.

Another conventional transistor has a lateral double-diffused MOS (LDMOS). The LDMOS has improved resistance and breakdown voltage characteristics. The LDMOS is also normally operated by an input signal having a high frequency. Further, since the LDMOS may be fabricated by processes for manufacturing standard CMOS and by additional processes, the LDMOS is employed in conventional process lines for manufacturing the standard CMOS. The LDMOS has a very short channel length so that the transistor has improved high frequency and resistance characteristics. To improve the breakdown voltage characteristic, an interval between the source region and the drain region that are doped with impurities at a high-concentration is widened. Thus, the drain region is needed to have a wide lightly doped region. A structural feature of the LDMOS is that the transistor has a channel region separated from a drift region, whereas other transistors have the channel and drift regions into one combined region. The drift region for maintaining the high voltage that is applied to the drain region is doped with impurities at a low-concentration to a great extent. The channel region through which the charge carrier passes has a very short length for suppressing the occurrence of the EHP. Additionally, the LDMOS has a base and a base contact for capturing an electron or a hole that is generated by moving the charge carrier.

The above-mentioned conventional transistors are required to have the wide low-concentration impurity region so that the area occupied by transistors in a semiconductor device is enlarged. Numbers of semiconductor devices on a wafer, that is, a net die, are reduced. Further, a photoresist pattern may be mis-aligned in an ion implantation process for forming the source/drain regions so that characteristics of a semiconductor device may be greatly changed. As a result, guaranteeing a process margin may be difficult.

SUMMARY OF THE INVENTION

The present invention provides a field effect transistor having a high breakdown voltage.

The present invention also provides an LDMOS transistor having a high breakdown voltage.

The present invention also provides a method of manufacturing a field effect transistor that has a high breakdown voltage.

The present invention also provides a method of manufacturing an LDMOS transistor that has a high breakdown voltage.

A field effect transistor in accordance with one aspect of the present invention includes a gate that is formed in a channel region of an active region defined on a substrate. A source is formed at a first surface portion of the active region that is adjacently disposed at a first side face of the gate. A drain is formed at a second surface portion of the active region that is positioned adjacent to a second side face of the gate opposite to the first side face. That is, the second surface portion is opposite to the first surface portion with respect to the gate. The drain has a protruded portion that is protruded from a surface portion of the substrate.

An LDMOS transistor in accordance with another aspect of the present invention includes a gate that is formed on a channel region of an active region defined on a substrate. A source is formed at a first surface portion of the active region that is positioned adjacent to a first side face of the gate. A drain is formed at a second surface portion of the active region that is positioned adjacent to a second side face of the gate opposite to the first side face. That is, the second surface portion is opposite to the first surface portion with respect to the gate. The drain has a protruded portion that is protruded from a surface portion of the substrate. A base makes contact with the drain and surrounds the channel region and the source.

In a method of manufacturing a field effect transistor in accordance with still another aspect of the present invention, a source is formed at a first surface portion of an active region that is defined on a substrate. A drain, having a protruded portion that is protruded from a surface portion of the substrate, is formed at a second surface portion of the active region that is opposite to the first surface portion of the active region, i.e., opposite to the source. A gate is formed on a channel region between the source and the drain.

In a method of manufacturing an LDMOS transistor in accordance with still another aspect of the present invention, an insulation layer is formed on a substrate to define an active region on the substrate. Lightly doped source/drain regions are formed at surface portions of the active region, the lightly doped source/drain regions being spaced apart from each other. A gate is formed on the active region between the lightly doped source/drain regions, the gate having a width greater than the distance at which the lightly doped source/drain regions are spaced apart. A protruded portion doped with impurities at a high-concentration is formed on the lightly doped drain region between the gate and the insulating layer. A heavily doped source region is formed at a surface portion of the lightly doped source region, and a heavily doped drain region is formed at a surface portion of the protruded portion.

In a method of manufacturing an LDMOS transistor in accordance with still another aspect of the present invention, a base is formed at a first surface portion of an active region that is defined on a substrate. A source is formed on the base. A drain having a protruded portion that is protruded from a surface portion of the substrate is formed at a second surface portion of the active region that is opposite to the first surface portion, i.e., opposite to the source. A gate is formed on a channel region between the source and the drain.

In a method of manufacturing an LDMOS transistor in accordance with still another aspect of the present invention, a base is formed at a first surface portion of an active region that is defined on a substrate. Insulation layers are formed at surface portions of the base and the substrate, respectively. A lightly doped drain region is formed at a surface portion of the active region. A gate is formed on the substrate adjacent to the lightly doped drain region. A protruded portion doped with impurities at a high-concentration is formed on the lightly doped drain region. A heavily doped source region is formed at a surface portion of the lightly doped source region, and a heavily doped drain region is formed at a surface portion of the protruded portion. A base contact doped with impurities at a high-concentration is formed between the gate and the heavily doped source region.

According to the present invention, the transistor has a reduced area. Also, a breakdown voltage is controllable without degrading a resistance characteristic. Further, an ion implantation process for forming a drain doped with impurities at a high-concentration is readily carried out.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

DESCRIPTION OF THE INVENTION

Hereinafter, transistors and method for forming the transistors in accordance with embodiments of the present invention are illustrated in detail with reference to the accompanying drawings.

Embodiment 1

Figure 1:
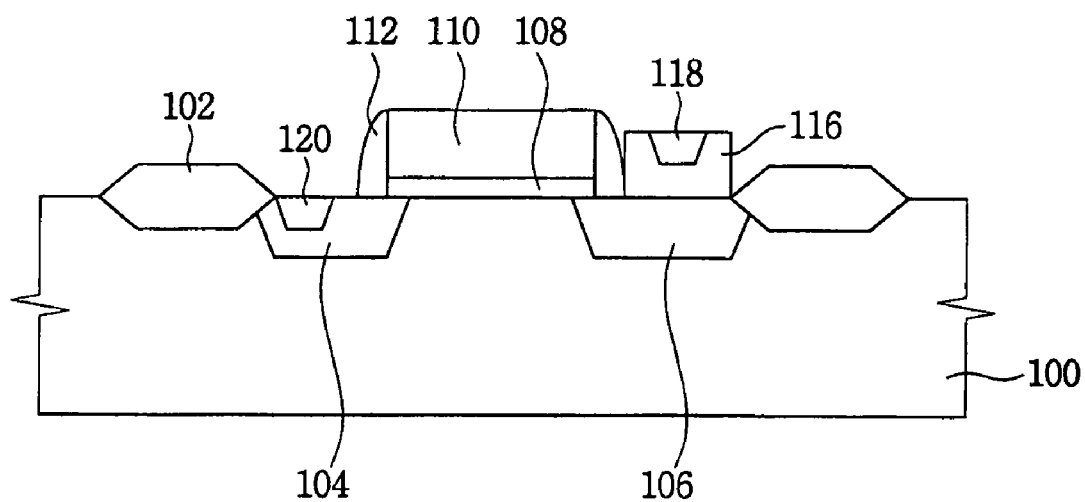
FIG. 1 is cross sectional view illustrating a field effect transistor in accordance with a first embodiment of the present invention.

FIG. 1 is cross sectional view illustrating a field effect transistor in accordance with a first embodiment of the present invention. In FIG. 1, wirings of a transistor are omitted.

Referring to FIG. 1, an insulation layer 102 for defining an active region is positioned at a surface portion of a substrate 100. The insulation layer 102 may be formed by a local oxidation of silicon (LOCOS) process or a trench isolation process. When the insulation layer 102 is formed by the trench isolation process, an electric field may be concentrated on a bottom corner of the insulation layer 102 so that an insulation characteristic between devices is degraded. Thus, the insulation layer 102 is preferably formed by the LOCOS process.

A field effect transistor (FET) is positioned on the active region that is defined by the insulating layer 102. A gate is located at a central portion of the transistor. The gate includes a dielectric layer pattern 108 and a conductive layer pattern 110. The gate may include a spacer 112 to protect the dielectric layer pattern 108 and the conductive layer pattern 110 in a subsequent etching process or an ion implantation process.

A source is positioned between a first side face of the gate and the insulation layer 102. The source includes a highly or heavily doped source region 120 and a lightly doped source region 104. The lightly doped source region 104 extends from the insulation layer 102 towards a lower portion of the dielectric layer pattern 108. That is, the lightly doped source region 104 and the dielectric layer pattern 108 are partially overlapped with each other. The heavily doped source region 120 is formed in the lightly doped source region 104 without being overlapped with the dielectric layer pattern 108. The lightly doped source region 104 preferably surrounds the heavily doped source region 120. Accordingly, the lightly doped source region 104 has a first depth from the surface of the substrate 100. The heavily doped source region 120 has a second depth less than the first depth from the surface of the substrate 100.

A drain is positioned between a second side face of the gate opposite to the first side face and the insulation layer 102. Accordingly, the drain is disposed opposite to the source with respect to the gate. The drain includes a lightly doped drain region 106, a protruded portion 116 doped with impurities at a high-concentration, and a heavily doped drain region 118 formed at a surface portion of the protruded portion 116. The lightly doped drain region 106 is formed at the surface portion of the substrate 100 that is disposed adjacent to the second side face of the gate. The lightly doped drain region 106 is partially overlapped with the dielectric layer pattern 108. The lightly doped drain region 106 has a third depth from the surface of the substrate 100. The protruded portion 116 is positioned between a gate spacer formed on the second face of the gate and the insulation layer 102. A height of the protruded portion 116 may vary in accordance with an operation voltage of the transistor. The height of the protruded portion 116 may be higher than that of the gate. Alternatively, the height of the protruded portion 116 may be substantially equal to or no more than that of the gate. The heavily doped drain region 118 is positioned on the protruded portion 116. An area of the transistor is remarkably reduced due to the lightly doped drain region 106 and the protruded portion 116.

FIGS. 2 to 7 are cross sectional views illustrating a method for forming the field effect transistor in FIG. 1.

Figure 2:
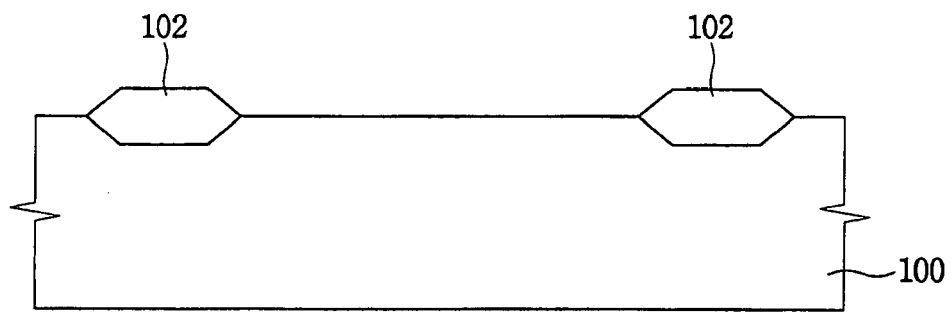
FIGS. 2 to 7 are cross sectional views illustrating a method of manufacturing the field effect transistor in FIG. 1.

Referring to FIG. 2, the insulation layer 102 is formed on the substrate 100 by a LOCOS process or a trench process. Preferably, the insulation layer 102 is formed by the LOCOS process.

The insulation layer 102 may be formed by the following method. A pad oxide layer (not shown) and a nitride layer (not shown) are subsequently formed on the substrate 100. A photoresist film (not shown) is formed on the nitride layer. The photoresist film is patterned to form a photoresist pattern (not shown). The nitride layer is etched using the photoresist pattern as an etching mask to partially expose the pad oxide layer. The exposed pad oxide layer is oxidized to transform into a partial oxide layer. The nitride layer and the pad oxide layer are removed to obtain the insulation layer 102 corresponding to the partial oxide layer. The insulation layer 102 defines an active region on the substrate on which the transistor is formed.

Figure 3:
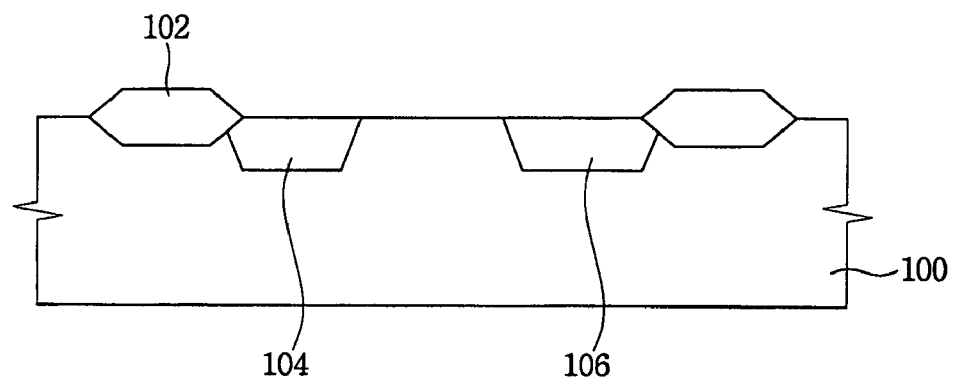

Referring to FIG. 3, a photoresist film (not shown) is formed on the substrate 100 and the insulation layer 102. The photoresist film is patterned to form a photoresist pattern (not shown). Impurities are implanted into the surface portions of the active region at a low concentration to form the lightly doped source region 104 and the lightly doped drain region 106 that is spaced apart from the lightly doped source region 104 by a predetermined distance. A diffusion process may be further performed after implanting the impurities. Alternatively, the source/drain regions may be formed prior to formation of the insulation layer 102.

Figure 4:
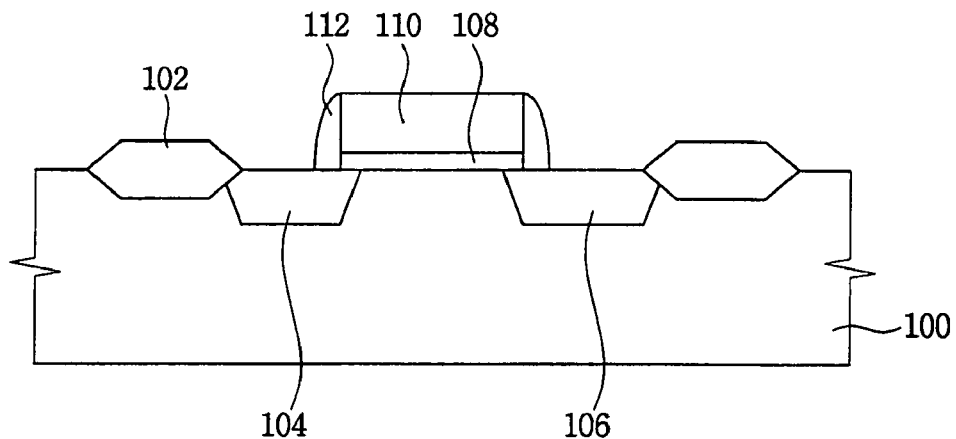

Referring to FIG. 4, a gate is formed on the surface portion of the substrate 100 between the lightly doped source region 104 and the lightly doped drain region 106. To form the gate, the dielectric layer (not shown) including oxide is formed on the substrate 100. The conductive layer (not shown) including polysilicon is formed on the dielectric layer. A photoresist film (not shown) is formed on the conductive layer. The photoresist film is patterned to form a photoresist pattern (not shown). The conductive layer and the dielectric layer are etched using the photoresist pattern as an etching mask to form the gate including the dielectric layer pattern 108 and the conductive layer pattern 110. The dielectric layer pattern 108 and the conductive layer pattern 110 have a width greater than the distance between the lightly doped source/drain regions 104 and 106. Thus, the dielectric layer pattern 108 is overlapped with the lightly doped source/drain regions 104 and 106. Additionally, the gate may include a spacer 112 that is formed on a sidewall of the dielectric layer pattern 108 and the conductive layer pattern 110. A nitride layer (not shown) is formed on the gate and the substrate 100. The nitride layer is etched-back to form the spacer 112.

Figure 5:
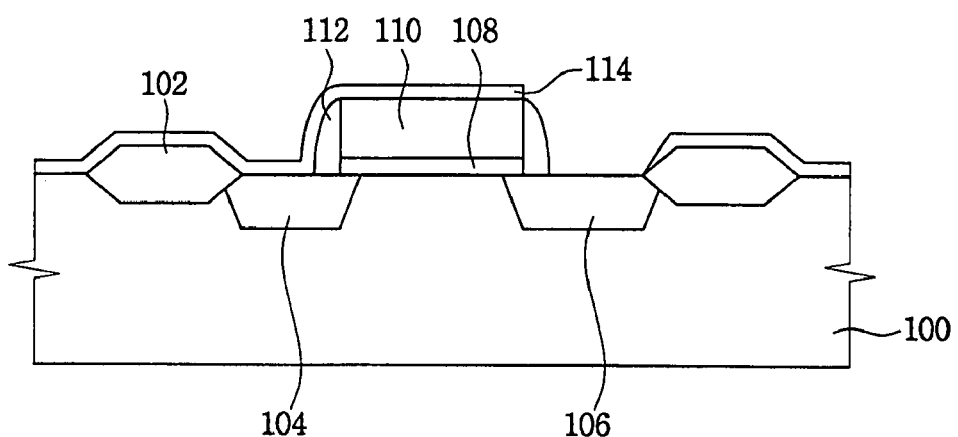

Referring to FIG. 5, a blocking layer (not shown) including oxide is formed on the gate and the substrate 100. A photoresist film (not shown) is formed on the blocking layer. The photoresist film is patterned to form a photoresist pattern (not shown) exposing the lightly doped drain region 106. The blocking layer is partially etched using the photoresist pattern as an etching mask to form a blocking layer pattern 114 exposing the lightly doped drain region 106 and the spacer 112. Here, in FIG. 5, the blocking layer pattern 114 exposes the spacer 112 and the lightly doped drain region 106. Alternatively, the blocking layer pattern 114 may expose only the lightly doped drain region 106 or the lightly doped drain region 106 and a portion of the insulation layer 102. Also, the blocking layer pattern 114 may expose the spacer 112, the lightly doped drain region 106 and a portion of the insulation layer 102. Accordingly, a margin in a photolithography process for forming the photoresist pattern is guaranteed.

Figure 6:
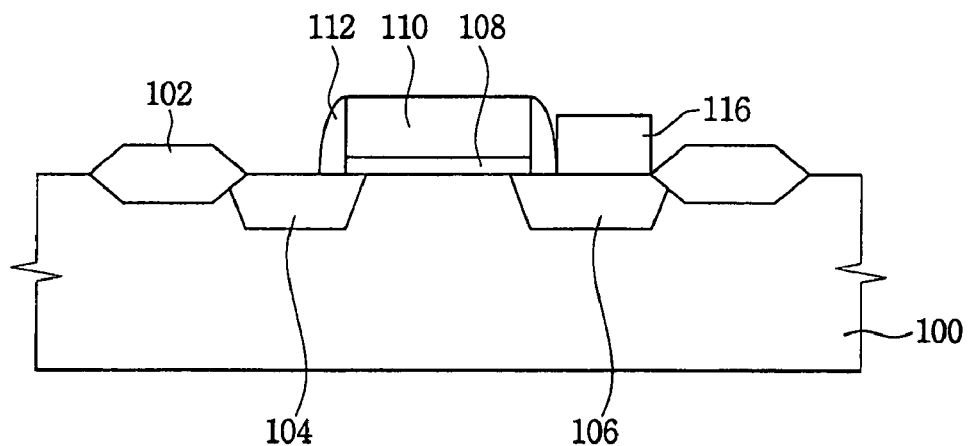

Referring to FIG. 6, a gas including a material that is substantially identical to that of the lightly doped drain region 106 is applied to the lightly doped drain region 106 to epitaxially grow the protruded portion 116 from the lightly doped drain region 106. Here, the blocking layer pattern 114 prevents the epitaxial growth of layers that are disposed under the blocking layer pattern 114. Accordingly, the protruded portion 116 is formed only on the exposed lightly doped drain region 106. In FIG. 6, the protruded portion 116 has a height less than that of the gate. Alternatively, the protruded portion 116 may have a height substantially equal to or no more than that of the gate in accordance with the operation voltage of the transistor. The protruded portion 116 is doped with impurities at a low-concentration. The protruded portion 116 also has a conductivity type substantially identical to that of the lightly doped source/drain regions 104 and 106.

Figure 7:
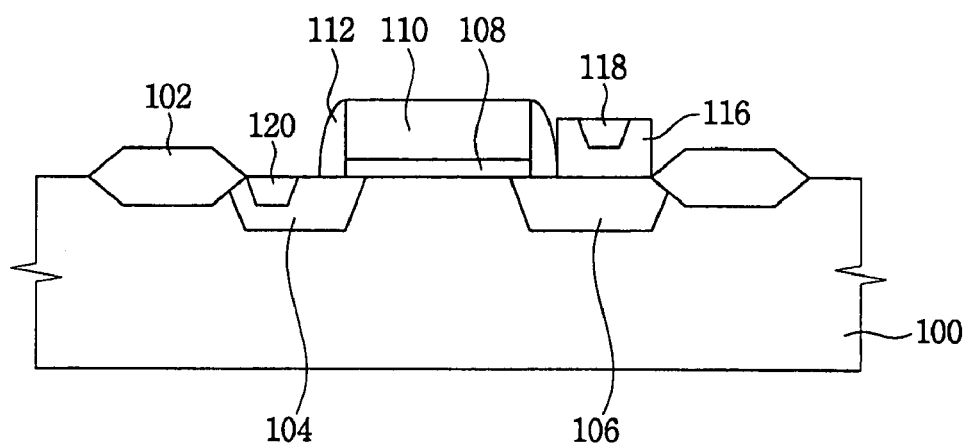

Referring to FIG. 7, impurities are implanted into the protruded portion 116 at a high concentration to form a heavily doped drain region 118. The heavily doped drain region 118 is formed at a surface portion of the protruded portion 116. Simultaneously, the heavily doped source region 120 is formed together with the heavily doped drain region 118 by implanting the impurities at a high concentration. Since the protruded portion 116 is positioned on the lightly doped drain region 106 and the heavily doped drain region 118 is positioned on the protruded portion 116, an effective length between the heavily doped source region 120 and the heavily doped drain region 118 is a sum of a horizontal length from the heavily doped source region 120 to the lightly doped drain region 106 and a vertical length from the lightly doped drain region 106 to the heavily doped drain region 118. Accordingly, the distance between the source and the drain is elongated so that the transistor having a high breakdown voltage has a narrow area.

In accordance with the invention, the transistor may be an N type transistor or a P type transistor. When the transistor is an N type transistor, the source/drain regions are an N type. When the transistor is a P type transistor, the source/drain regions are a P type. Additionally, the transistor may include a well (not shown) that includes the source, the drain and the gate and also is distinguished from a bulk portion of the substrate.

Embodiment 2

Figure 8:
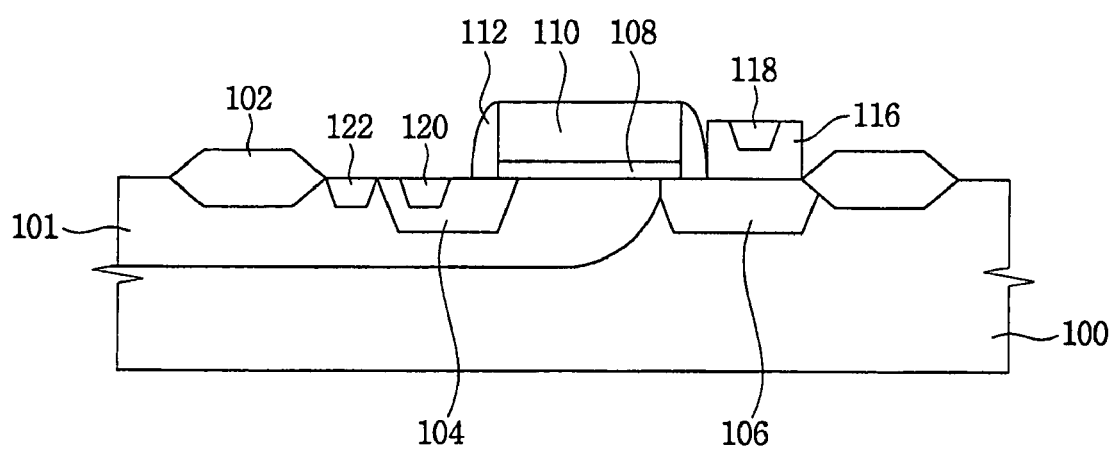
FIG. 8 is a cross sectional view illustrating an LDMOS transistor in accordance with a second embodiment of the present invention.

FIG. 8 is cross sectional view illustrating an LDMOS transistor in accordance with a second embodiment of the present invention.

Referring to FIG. 8, an insulation layer 102 for defining an active region is positioned at a surface portion of a substrate 100. The insulation layer 102 may be formed by a local oxidation of silicon (LOCOS) process or a trench isolation process. When the insulation layer 102 is formed by the trench isolation process, an electric field may be concentrated on a bottom corner of the insulation layer 102 so that an insulation characteristic between devices is degraded. Thus, the insulation layer 102 is preferably formed by the LOCOS process.

A field effect transistor (FET) is positioned on the active region that is defined by the insulating layer 102. A gate is located at a central portion of the transistor. The gate includes a dielectric layer pattern 108 and a conductive layer pattern 110. The gate may include a spacer 112 to protect the dielectric layer pattern 108 and the conductive layer pattern 110 in a subsequent etching process or an ion implantation process.

A source is positioned between a first side face of the gate and the insulation layer 102. The source includes a heavily doped source region 120, a lightly doped source region 104 and a base contact 122. The lightly doped source region 104 extends from the insulation layer 102 towards a lower portion of the dielectric layer pattern 108. Thus, the lightly doped source region 104 and the dielectric layer pattern 108 are partially overlapped with each other. The heavily doped source region 120 is formed in the lightly doped source region 104 without being overlapped with the dielectric layer pattern 108. The lightly doped source region 104 preferably surrounds the heavily doped source region 120. Accordingly, the lightly doped source region 104 has a first depth from the surface of the substrate 100. The heavily doped source region 120 has a second depth less than the first depth from the surface of the substrate 100. The base contact 122 makes contact with the lightly doped source region 104. The base contact 122 is also electrically connected to the heavily doped source region 120. The base contact 122 has a conductivity type opposite to that of the low-concentration and heavily doped source regions 104 and 120. When the low-concentration and heavily doped source regions 104 and 120 are N type, the base contact 122 is P type, and vice versa.

A base 101 is positioned under a channel region beneath the gate and the source. The base 101 has a conductivity type substantially identical to that of the base contact 122.

A drain is positioned between a second side face of the gate opposite to the first side face and the insulation layer 102. Accordingly, the drain is disposed opposite to the source with respect to the gate. The drain includes a lightly doped drain region 106, a protruded portion 116 doped with impurities at a high-concentration, and a heavily doped drain region 118 formed at a surface portion of the protruded portion 116. The lightly doped drain region 106 is formed at the surface portion of the substrate 100 that is disposed adjacent to the second side face of the gate. The lightly doped drain region 106 is partially overlapped with the dielectric layer pattern 108. The lightly doped drain region 106 has a third depth from the surface of the substrate 100. The protruded portion 116 is positioned between a gate spacer formed on the second face of the gate and the insulation layer 102. A height of the protruded portion 116 may vary in accordance with an operation voltage of the transistor. The height of the protruded portion 116 may be higher than that of the gate. Alternatively, the height of the protruded portion 116 may be substantially equal to or no more than that of the gate. The heavily doped drain region 118 is positioned on the protruded portion 116. An area of the transistor is remarkably reduced due to the lightly doped drain region 106 and the protruded portion 116.

Additionally, the transistor may include a well (not shown) that includes the base 101 and the lightly doped drain region 106. The well has a conductivity type opposite to that of the base 101 and substantially identical to that of the lightly doped drain region 106.

FIGS. 9 to 14 are cross sectional views illustrating a method for forming the LDMOS transistor in FIG. 8.

Figure 9:
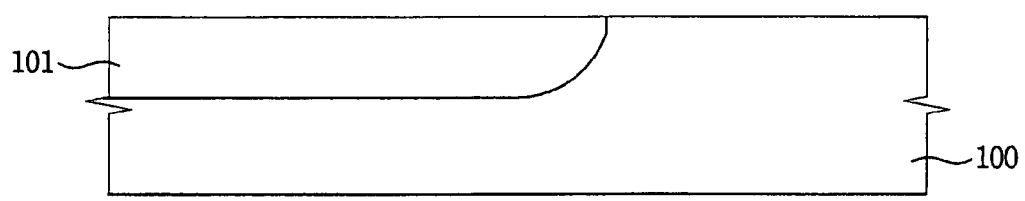
FIGS. 9 to 14 are cross sectional views illustrating a method of manufacturing the LDMOS transistor in FIG. 8.

Referring to FIG. 9, the base 101 is formed at a surface portion of the substrate 100 by an ion implantation process or ion implantation/diffusion processes. In particular, a photoresist film (not shown) is formed on the substrate 100. The photoresist film is patterned to form a photoresist pattern (not shown). Impurities are implanted into the substrate using the photoresist pattern as an ion implanting mask to form the base 101. Additionally, the impurities in the base 101 may be diffused for controlling a depth and a width of the base 101.

Figure 10:
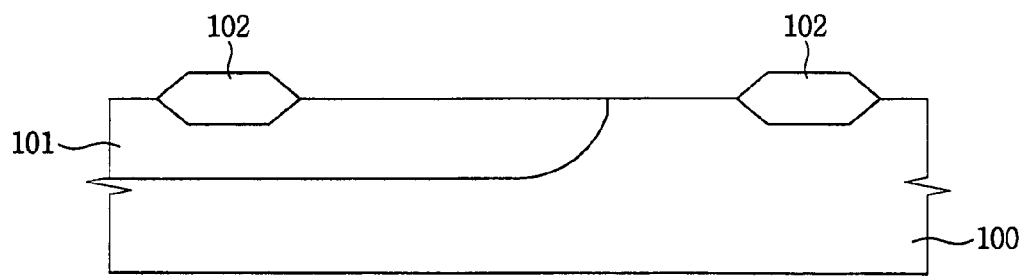

Referring to FIG. 10, the insulation layer 102 is formed at surface portions of the base 101 and the substrate 100 by a LOCOS process or a trench isolation process. Preferably, the insulation layer 102 is formed by the LOCOS process.

The insulation layer 102 may be formed by a following method. A pad oxide layer (not shown) and a nitride layer (not shown) are subsequently formed on the substrate 100. A photoresist film (not shown) is formed on the nitride layer. The photoresist film is patterned to form a photoresist pattern (not shown). The nitride layer is etched using the photoresist pattern as an etching mask to partially expose the pad oxide layer. The exposed pad oxide layer is oxidized to become a partial oxide layer. The nitride layer and the pad oxide layer are removed to obtain the insulation layer 102 corresponding to the partial oxide layer. The insulation layer 102 defines an active region on the substrate on which the transistor is formed.

Figure 11:
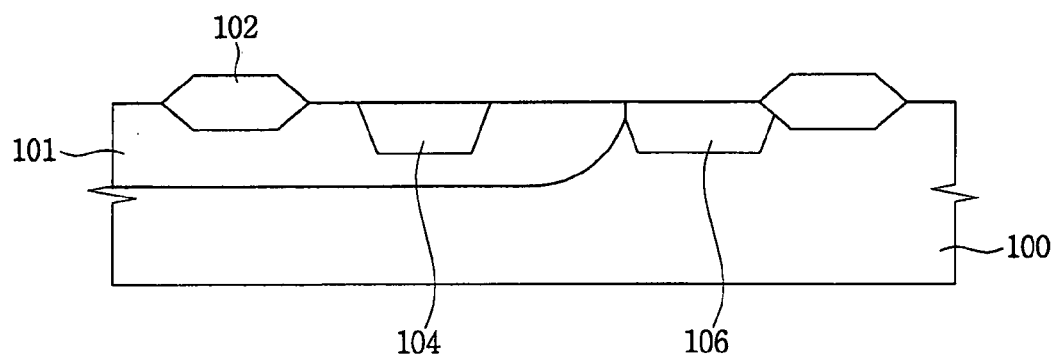

Referring to FIG. 11, a photoresist film (not shown) is formed on the substrate 100 and the insulation layer 102. The photoresist film is patterned to form a photoresist pattern (not shown). Impurities are implanted into the surface portions of the active region at a low concentration to form the lightly doped source region 104 and the lightly doped drain region 106 that is spaced apart from the lightly doped source region 104 by a predetermined distance. A diffusion process may be further performed after implanting the impurities. Alternatively, the source/drain regions may be formed before forming the insulation layer 102.

Figure 12:
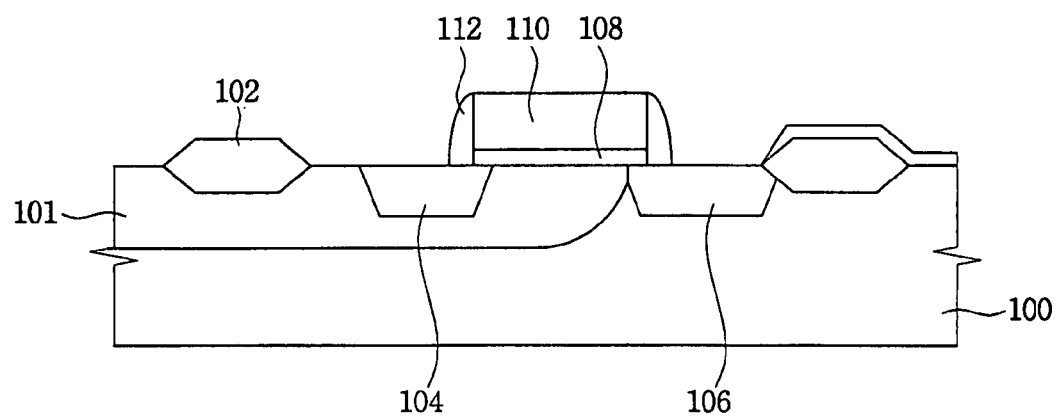

Referring to FIG. 12, a gate is formed on the surface portion of the substrate 100 between the lightly doped source region 104 and the lightly doped drain region 106. To form the gate, the dielectric layer (not shown) including oxide is formed on the substrate 100. The conductive layer (not shown) including polysilicon is formed on the dielectric layer. A photoresist film (not shown) is formed on the conductive layer. The photoresist film is patterned to form a photoresist pattern (not shown). The conductive layer and the dielectric layer are etched using the photoresist pattern as an etching mask to form the gate including the dielectric layer pattern 108 and the conductive layer pattern 110. The dielectric layer pattern 108 and the conductive layer pattern 110 have a width greater than the distance between the lightly doped source/drain regions 104 and 106. Thus, the dielectric layer pattern 108 is overlapped with the lightly doped source/drain regions 104 and 106. Additionally, the gate may include a spacer 112 that is formed on a sidewall of the dielectric layer pattern 108 and the conductive layer pattern 110. A nitride layer (not shown) is formed on the gate and the substrate 100. The nitride layer is etched-back to form the spacer 112.

Figure 13:
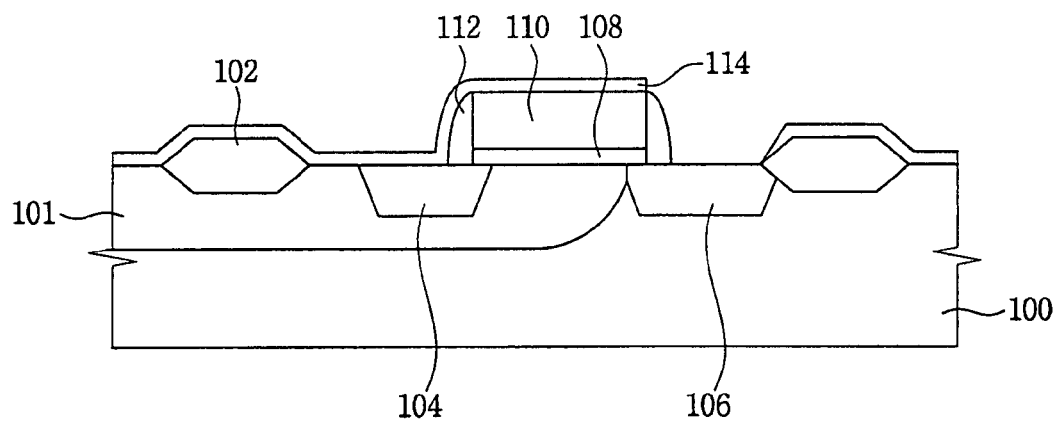

Referring to FIG. 13, a blocking layer (not shown) including oxide is formed on the gate and the substrate 100. A photoresist film (not shown) is formed on the blocking layer. The photoresist film is patterned to form a photoresist pattern (not shown) exposing the lightly doped drain region 106. The blocking layer is partially etched using the photoresist pattern as an etching mask to form a blocking layer pattern 114 exposing the lightly doped drain region 106 and the spacer 112. Here, in FIG. 13, the blocking layer pattern 114 exposes the spacer 112 and the lightly doped drain region 106. Alternatively, the blocking layer pattern 114 may expose only the lightly doped drain region 106 or the lightly doped drain region 106 and a portion of the insulation layer 102. Also, the blocking layer pattern 114 may expose the spacer 112, the lightly doped drain region 106 and the portion of the insulation layer 102. Accordingly, a margin in a photolithography process for forming the photoresist pattern is guaranteed.

Figure 14:
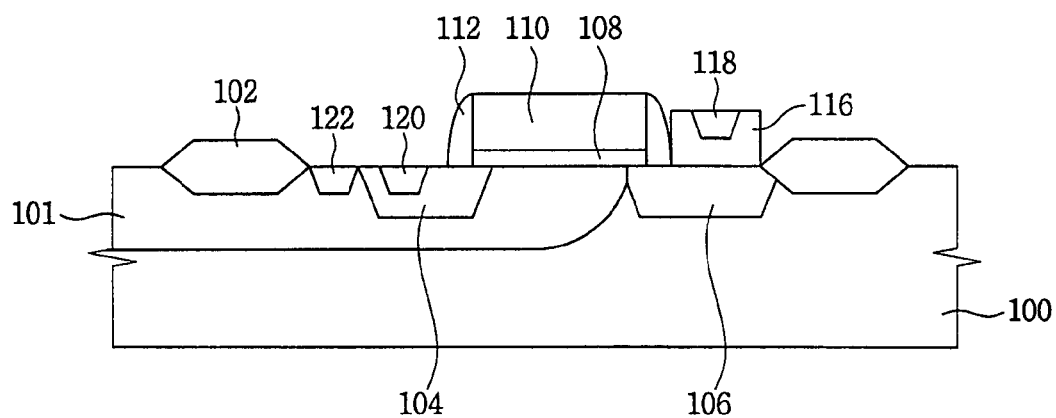

Referring to FIG. 14, a gas including a material that is substantially identical to that of the lightly doped drain region 106 is applied to the lightly doped drain region 106 to epitaxially grow the protruded portion 116 from the lightly doped drain region 106. Here, the blocking layer pattern 114 prevents the epitaxial growth of layers that are disposed under the blocking layer pattern 114. Accordingly, the protruded portion 116 is formed only on the exposed lightly doped drain region 106. In FIG. 14, the protruded portion 116 has a height less than that of the gate. Alternatively, the protruded portion 116 may have a height substantially equal to or no more than that of the gate in accordance with the operation voltage of the transistor. The protruded portion 116 is doped with impurities at a low-concentration. Also, the protruded portion 116 has a conductivity type substantially identical to that of the lightly doped source/drain regions 104 and 106.

High-concentration impurities are implanted into the protruded portion 116 to form a heavily doped drain region 118. The heavily doped drain region 118 is formed at a surface portion of the protruded portion 116. Simultaneously, the heavily doped source region 120 is formed together with the heavily doped drain region 118 by implanting the high-concentration impurities. Since the protruded portion 116 is positioned on the lightly doped drain region 106 and the heavily doped drain region 118 is positioned on the protruded portion 116, an effective length between the heavily doped source region 120 and the heavily doped drain region 118 is a sum of a horizontal length from the heavily doped source region 120 to the lightly doped drain region 106 and a vertical length from the lightly doped drain region 106 to the heavily doped drain region 118. Accordingly, the distance between the source and the drain is elongated so that the transistor having a high breakdown voltage has a narrow area.

A base contact 122 doped with impurities at a high-concentration is formed between the lightly doped source region 104 and the insulation layer 102. The base contact 122 has a conductivity type opposite to that of the lightly doped source region 104 and the heavily doped source region 120. Accordingly, when the lightly doped source region 104 and the heavily doped source region 120 are an N type, the base contact 122 is a P type substantially identical to that of the base 101. The base contact 122 is formed by an ion implantation process. The base contact 122 also makes contact with the lightly doped source region 104.

Thus, the base contact 122 is electrically connected to the heavily doped source region 120. Alternatively, the base contact 122 may be formed before forming the heavily doped source region 120 and the heavily doped drain region 118. The base contact 122 captures minority carriers among the EHPs that are generated from the base 101 defining the channel region.

An effective length of the LDMOS transistor is the distance between the lightly doped source region 104 and the lightly doped drain region 106 so that the resistance of the LDMOS transistor is reduced. Further, the effective length extends by the protruded portion 116 so that the breakdown voltage increases.

In particular, the protruded portion 116 is positioned on the lightly doped drain region 106, and the heavily doped drain region 118 is positioned on the protruded portion 116. Accordingly, the effective length between the heavily doped source region 120 and the heavily doped drain region 118 is the sum of a horizontal length from the heavily doped source region 120 to the lightly doped drain region 106 and a vertical length from the lightly doped drain region 106 to the heavily doped drain region 118. Accordingly, the distance between the source and the drain is elongated so that the transistor having a high breakdown voltage has a narrow area.

The transistor may be an N type transistor or a P type transistor in the present embodiment. When the transistor is the N type transistor, the source/drain regions are N type, and the base and the base contact are P type. When the transistor is the P type transistor, the source/drain regions are P type, and the base and the base contact are N type. Additionally, the transistor may include a well (not shown) that includes the source, the drain, the gate, and the base, and is also distinguished from a bulk portion of the substrate. The well has a conductivity type substantially identical to that of the drain regions though concentrations of the well and the drain regions are different from each other.

According to the present invention, the FET and the LDMOS transistors having a small area are manufactured without degrading characteristics of the resistance and the breakdown voltage. Further, a sufficient process margin in forming the heavily doped drain region is guaranteed. The drift region in the heavily doped drain region that is maintained in a high voltage is readily controlled. As a result, the transistors are readily manufactured in accordance with the operation voltage of the transistors.

While this invention has been particularly shown and described with reference to preferred embodiments thereof, it will be understood by those skilled in the art that various changes in form and details may be made therein without departing from the spirit and scope of-the invention as defined by the appended claims.

What is claimed is:

1. A lateral double diffused metal-oxide-semiconductor (LDMOS) transistor, comprising:
    a gate formed on a channel region of an active region, the active region defined at a surface portion of a substrate;
    a source formed at a first surface portion of the active region that is positioned adjacent to a first side face of the gate;
    a drain formed at a second surface portion of the active region that is positioned adjacent to a second side face of the gate opposite to the first side face, the drain having a protruded portion that is protruded from a surface portion of the substrate; and
    a base contacting the drain and surrounding the channel region and the source.

2. The transistor of claim 1, wherein the gate comprises:
    a dielectric layer pattern formed on the channel region; and
    a conductive layer pattern formed on the dielectric layer pattern.

3. The transistor of claim 2, wherein the source comprises a heavily doped source region and a base contact electrically connected to the heavily doped source region, and the base contact is formed at a surface portion of the active region that is positioned farther than the heavily doped source region with respect to the gate.

4. The transistor of claim 3, wherein the base contact comprises a conductivity type that is different from that of the heavily doped source region.

5. The transistor of claim 4, wherein the source further comprises a lightly doped source region having a portion that is positioned under the dielectric layer, and surrounding the heavily doped source region.

6. The transistor of claim 2, wherein the drain comprises a lightly doped drain region, the protruded portion being positioned on the lightly doped drain region.

7. The transistor of claim 6, wherein a heavily doped drain region is formed at a surface portion of the protruded portion.

* * * * *